(12) United States Patent
Suzuki et al.

(10) Patent No.: US 9,472,736 B2
(45) Date of Patent: Oct. 18, 2016

(54) ETCHING METHOD

(71) Applicant: El-Seed Corporation, Nagoya-shi (JP)

(72) Inventors: Atsushi Suzuki, Nagoya (JP); Koichi Naniwae, Nagoya (JP); Toshiyuki Kondo, Nagoya (JP); Midori Mori, Nagoya (JP); Fumihara Teramae, Nagoya (JP)

(73) Assignee: EL-SEED Corporation, Nagoya-shi, Aichi (JP)

( * ) Notice: Subject to any disclaimer, the term of this patent is extended or adjusted under 35 U.S.C. 154(b) by 0 days.

(21) Appl. No.: 14/357,185

(22) PCT Filed: Nov. 6, 2012

(86) PCT No.: PCT/JP2012/078712
§ 371 (c)(1),
(2) Date: May 8, 2014

(87) PCT Pub. No.: WO2013/073417
PCT Pub. Date: May 23, 2013

(65) Prior Publication Data
US 2014/0312004 A1 Oct. 23, 2014

(30) Foreign Application Priority Data
Nov. 15, 2011 (JP) .................. 2011-249370

(51) Int. Cl.
*H01L 33/58* (2010.01)
*H01L 33/00* (2010.01)
(Continued)

(52) U.S. Cl.
CPC .............. *H01L 33/58* (2013.01); *H01L 33/005* (2013.01); *H01L 33/007* (2013.01); *H01L 33/22* (2013.01); *H01L 33/12* (2013.01); *H01L 2933/0033* (2013.01); *H01L 2933/0083* (2013.01)

(58) Field of Classification Search
CPC ...... H01L 33/007; H01L 33/22; H01L 33/58
USPC .......................................................... 216/48
See application file for complete search history.

(56) References Cited

U.S. PATENT DOCUMENTS 4,472,237 A * 9/1984 Deslauriers ....... H01L 21/28061
148/DIG. 100
4,554,048 A * 11/1985 Manocha ............ H01L 21/3086
204/192.37
(Continued)

FOREIGN PATENT DOCUMENTS

JP H09-213687 A 8/1997
JP 2000-221698 A 8/2000
(Continued)

OTHER PUBLICATIONS

International Search Report dated Dec. 4, 2012 in International Patent Application Publication No. PCT/JP2012/078712.
(Continued)

*Primary Examiner* — Duy Deo
*Assistant Examiner* — Mahmoud Dahimene
(74) *Attorney, Agent, or Firm* — McGinn IP Law Group, PLLC

(57) ABSTRACT

Provided are an etching method capable of increasing an etching selectivity between a subject material and a resist, a sapphire substrate processed using the etching method, and a light-emitting device including the sapphire substrate. An etching method using a plasma etching apparatus includes: a resist film forming step of forming a resist film on a subject material; a pattern forming step of forming a predetermined pattern on the resist film; a resist degenerating step of exposing the resist film on which the pattern is formed to plasma under a predetermined degeneration condition to degenerate the resist film and increase an etching selectivity; and a subject material etching step of exposing the subject material to plasma under an etching condition different from the degeneration condition to etch the subject material using the resist film having an increased etching selectivity as a mask.

10 Claims, 7 Drawing Sheets

(51) Int. Cl.
*H01L 33/22* (2010.01)
*H01L 33/12* (2010.01)

(56) References Cited

U.S. PATENT DOCUMENTS

| | | | |
|---|---|---|---|
| 4,729,815 A | | 3/1988 | Leung |
| 2003/0219683 A1 | | 11/2003 | Nagarajan et al. |
| 2004/0079727 A1 | | 4/2004 | Taylor et al. |
| 2005/0158982 A1* | | 7/2005 | Kanamura .................. 438/622 |
| 2011/0059616 A1 | | 3/2011 | Narishige et al. |
| 2012/0074097 A1* | | 3/2012 | Lee et al. .................. 216/48 |
| 2012/0208308 A1* | | 8/2012 | Suzuki ........................ 438/29 |

FOREIGN PATENT DOCUMENTS

| | | |
|---|---|---|
| JP | 2003-069158 A | 3/2003 |
| JP | 2005-136106 A | 5/2005 |
| JP | 2007-184390 A | 7/2007 |
| JP | 2008-110895 A | 5/2008 |
| JP | 2009-164626 A | 7/2009 |
| JP | 2009-271289 A | 11/2009 |
| JP | 2010-074090 A | 4/2010 |
| JP | 2011-060916 A | 3/2011 |
| JP | 2011-134800 A | 7/2011 |

OTHER PUBLICATIONS

European Search Report dated Apr. 21, 2015.
Japanese Office Action dated Jul. 17, 2015 with a partial English translation.
Chinese Office Action dated Dec. 21, 2015, with a partial English translation.
Chinese Office Action dated Aug. 1, 2016, with an English translation.
Japanese Office Action dated Jun. 28, 2016 with an English translation.

* cited by examiner

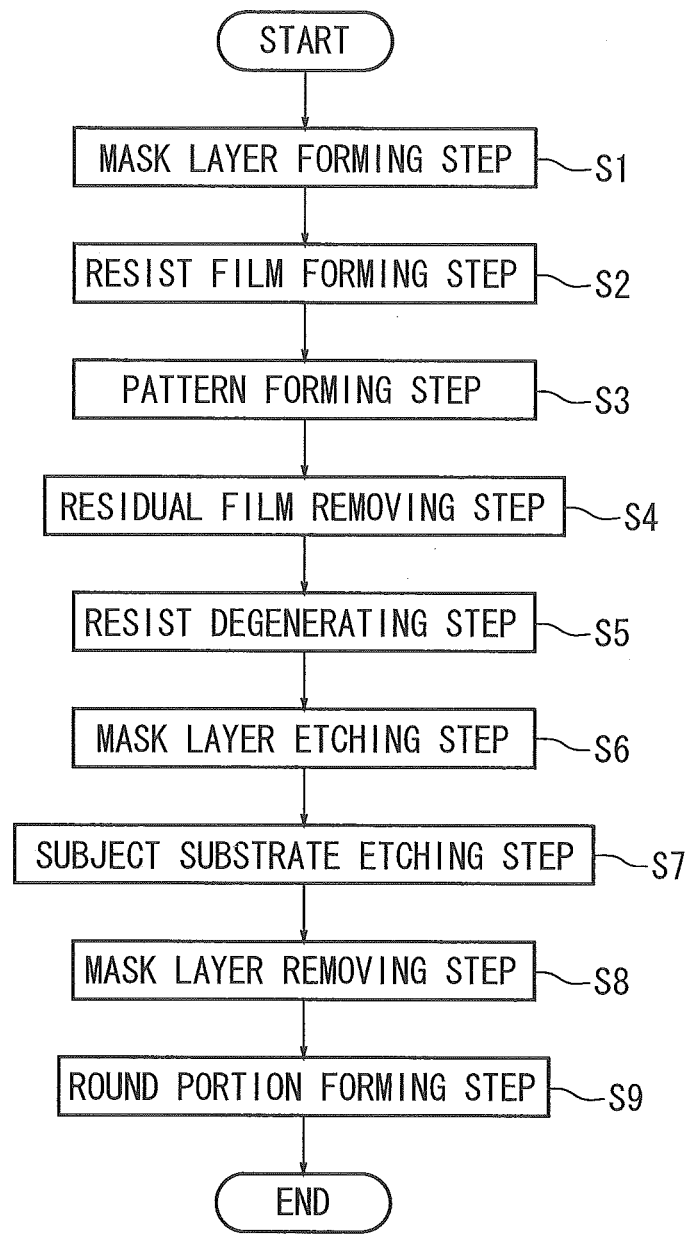

FIG. 3A
(a) 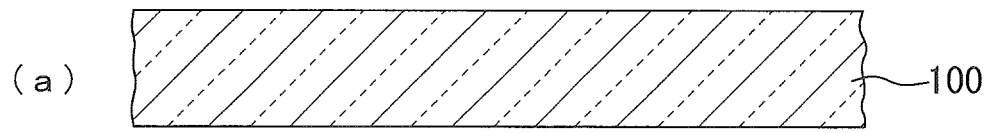
(b) 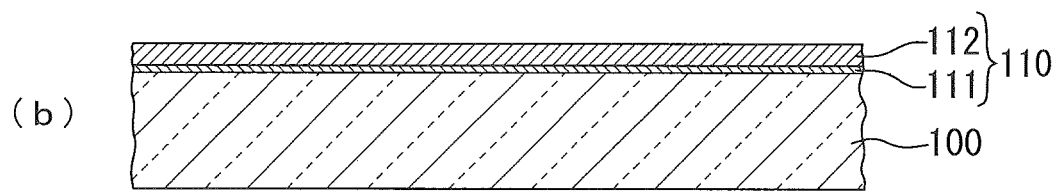
(c) 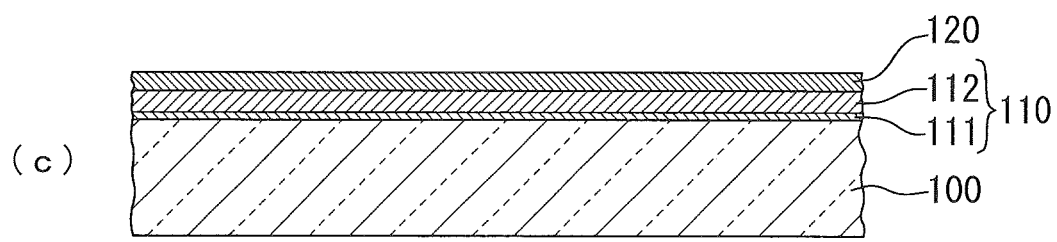
(d) 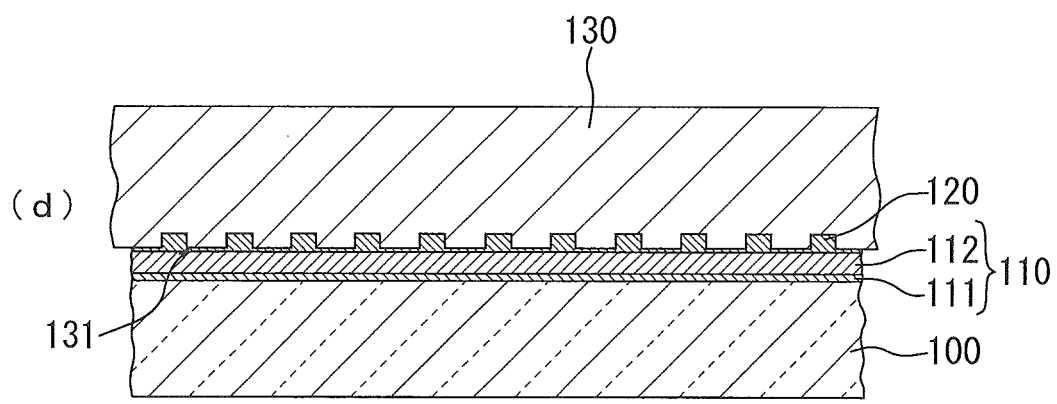
(e) 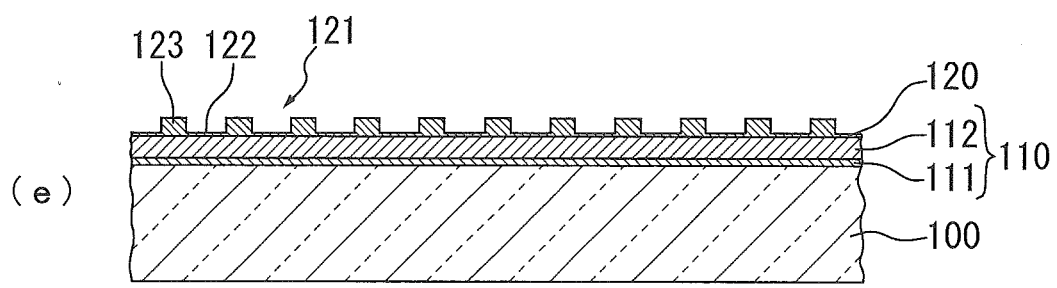

ETCHING METHOD

TECHNICAL FIELD

The present invention relates to an etching method using plasma, a sapphire substrate processed using the etching method, and a light-emitting device including the sapphire substrate.

BACKGROUND ART

According to a general subject material etching method, a substrate having a resist film formed on a surface is etched using a resist film as a mask (for example, see Patent Literature 1). For example, in an etching method disclosed in Patent Literature 1, a mixed gas in which a carbon-based gas is added to an etching gas is excited into a plasma state to etch a sapphire substrate, and the flow rate of the carbon-based gas is adjusted to adjust a tapered shape of convex portions.

CITATION LIST

Patent Literature

Patent Literature 1: Japanese Patent Application Publication No. 2011-134800

SUMMARY OF INVENTION

Technical Problem

However, in the conventional etching method, etching is performed by taking a selectivity determined by the materials of a subject material and a resist into consideration. When fine and deep shapes are formed on a subject material, if appropriate materials meeting the selectivity are not present, it is not possible to form a desired shape.

The present invention has been made in view of the circumstances and an object of the present invention is to provide an etching method capable of increasing an etching selectivity between a subject material and a resist, a sapphire substrate processed using the etching method, and a light-emitting device including the sapphire substrate.

Solution to Problem

In order to attain the object, according to an aspect of the present invention, there is provided an etching method including: a resist film forming step of forming a resist film on a subject material; a pattern forming step of forming a predetermined pattern on the resist film; a resist degenerating step of exposing the resist film on which the pattern is formed to plasma under a predetermined degeneration condition to degenerate the resist film and increase an etching selectivity; and a subject material etching step of exposing the subject material to plasma under an etching condition different from the degeneration condition to etch the subject material using the resist film having an increased etching selectivity as a mask.

In the etching method, a bias output in the degeneration condition may be lower than that of the etching condition.

In the etching method, the subject material may be a substrate mask layer formed on a predetermined subject substrate.

The etching method may further include a substrate etching step of etching the subject substrate using the etched substrate mask layer as a mask.

In the etching method, the substrate etching step may involve forming a concave-convex shape having a period of 1 µm or smaller on the subject substrate.

In the etching method, a concave-convex shape having a depth of 300 nm or larger may be formed on the subject substrate.

In the etching method, the subject substrate may be a sapphire.

According to another aspect of the present invention, there is provided a sapphire substrate on which concave-convex structures are formed according to the etching method.

According to still another aspect of the present invention, there is provided a light-emitting device including the sapphire substrate and a semiconductor light-emitting layer formed on the sapphire substrate.

According to still another aspect of the present invention, there is provided an etching method, including: a resist film forming step of forming a resist film on a subject material; a pattern forming step of forming a predetermined pattern on the resist film; a resist degenerating step of exposing the resist film on which the pattern is formed to plasma under a predetermined degeneration condition to degenerate the resist film and increase an etching selectivity; a subject material etching step of exposing the subject material to plasma under an etching condition different from the degeneration condition to etch the subject material using the resist film having an increased etching selectivity as a mask, the subject material being a substrate mask layer formed on a predetermined subject substrate, and the subject substrate being a sapphire substrate; and a substrate etching step of etching the sapphire substrate using the etched substrate mask layer as a mask to form a concave-convex shape having a period of 1 µm on the sapphire substrate, in which the resist degenerating step involves applying a predetermined bias output using Ar gas plasma as the plasma to induce the Ar gas plasma to the substrate mask layer, and the etching step involves applying a bias output higher than the degeneration condition using Ar gas plasma as the plasma to induce the Ar gas plasma to the substrate mask layer.

In the etching method, the substrate etching step may involve forming a concave-convex shape having a depth of 300 nm or larger on the sapphire substrate.

In the etching method, the substrate etching step may involve forming a concave-convex shape having a depth of 500 nm or larger on the sapphire substrate.

The etching method may further include, subsequently to the pattern forming step, a residual film removing step of removing a residual film of the resist film by plasma ashing.

In the etching method, the pattern forming step may involve pressing the resist film with a mold and curing the resist film while maintaining the resist film in the pressed state to transfer concave-convex structures of the mold to the resist film.

In the etching method, the substrate etching step may involve etching the sapphire substrate in a state where the resist film remains on the substrate mask layer.

In the etching method, the substrate mask layer may include a $SiO_2$ layer on the sapphire substrate and a Ni layer on the $SiO_2$ layer, and the substrate etching step may involve etching the sapphire substrate in a state where the $SiO_2$ layer, the Ni layer, and the resist film are stacked.

The etching method may further include, subsequently to the substrate etching step, a mask layer removing step of removing the substrate mask layer remaining on the sapphire substrate using a predetermined removal solution.

In the etching method, the mask layer removing step may involve removing the resist film by $O_2$ ashing and then removing the substrate mask layer remaining on the sapphire substrate using the predetermined removal solution.

According to still another aspect of the present invention, there is provided an etching method including: a resist film forming step of forming a resist film on a subject material; a pattern forming step of forming a predetermined pattern on the resist film; a resist degenerating step of exposing the resist film on which the pattern is formed to plasma under a predetermined degeneration condition to degenerate the resist film and increase an etching selectivity; a subject material etching step of exposing the subject material to plasma under an etching condition different from the degeneration condition to etch the subject material using the resist film having an increased etching selectivity as a mask, the subject material being a substrate mask layer formed on a predetermined subject substrate, and the subject substrate being a sapphire substrate; and a substrate etching step of etching the sapphire substrate using the etched substrate mask layer as a mask to form a concave-convex shape on the sapphire substrate, in which the resist degenerating step involves applying a predetermined bias output using Ar gas plasma as the plasma to induce the Ar gas plasma to the substrate mask layer, and the etching step involves applying a bias output higher than the degeneration condition using Ar gas plasma as the plasma to induce the Ar gas plasma to the substrate mask layer.

Advantageous Effects of Invention

According to the present invention, it is possible to increase the etching selectivity between a subject material and a resist.

BRIEF DESCRIPTION OF DRAWINGS

FIG. 2 is a flowchart illustrating an etching method;

FIG. 3A illustrates the process of a method of etching a subject substrate and a mask layer, in which (a) illustrates a subject substrate before processing, (b) illustrates a state where a mask layer is formed on the subject substrate, (c) illustrates a state where a resist film is formed on the mask layer, (d) illustrates a state where a mold is in contact with the resist film, and (e) illustrates a state where a pattern is formed on the resist film;

DESCRIPTION OF EMBODIMENTS

Figure 1:
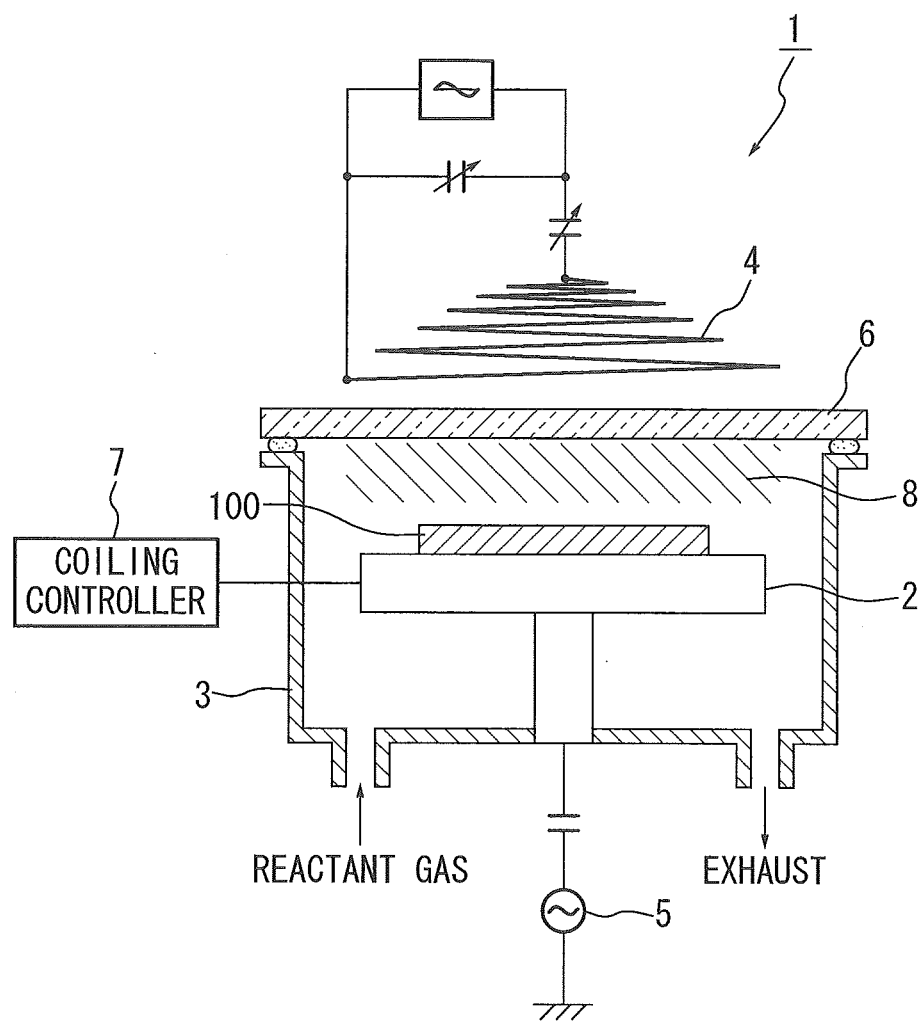
FIG. 1 is a schematic diagram for describing a plasma etching apparatus according to an embodiment of the present invention.

FIG. 1 is a schematic diagram for describing a plasma etching apparatus according to an embodiment of the present invention.

As illustrated in FIG. 1, a plasma etching apparatus 1 is an inductively coupled plasma (ICP) etching apparatus and includes a planar substrate holder 2 that holds a subject substrate 100, a container 3 that accommodates the substrate holder 2, a coil 4 provided above the container 3 with a quartz plate 6 interposed, and a power supply 5 connected to the substrate holder 2. The coil 4 is a solid spiral coil that supplies high-frequency power from the center of the coil and a terminating end at the outer periphery of the coil is grounded. The subject substrate 100 that is to be etched is placed on the substrate holder 2 directly or with a transport tray interposed. A cooling mechanism for cooling the subject substrate 100 is included in the substrate holder 2 and is controlled by a cooling controller 7. The container 3 has a supply port through which various gases such as $O_2$ gas, Ar gas, and the like can be supplied.

When the plasma etching apparatus 1 performs etching, the subject substrate 100 is placed on the substrate holder 2, and then, air inside the container 3 is exhausted to create a pressure-reduced state. Moreover, a predetermined processing gas is supplied into the container 3 and the pressure of the gas inside the container 3 is adjusted. After that, high-frequency power is supplied to the coil 4 and the substrate holder 2 for a predetermined period to generate plasma 8 of a reactant gas. With this plasma 8, the subject substrate 100 is etched.

Next, an etching method using the plasma etching apparatus 1 will be described with reference to FIGS. 2, 3A, and 3B.

FIG. 2 is a flowchart illustrating the etching method. As illustrated in FIG. 2, the etching method of the present embodiment includes a mask layer forming step S1, a resist film forming step S2, a pattern forming step S3, a residual film removing step S4, a resist degenerating step S5, a mask layer etching step S6, a subject substrate etching step S7, a mask layer removing step S8, and a round portion forming step S9.

FIG. 3A illustrates the process of a method of etching a subject substrate and a mask layer, in which (a) illustrates a subject substrate before processing, (b) illustrates a state where a mask layer is formed on the subject substrate, (c) illustrates a state where a resist film is formed on the mask layer, (d) illustrates a state where a mold is in contact with the resist film, and (e) illustrates a state where a pattern is formed on the resist film.

Figure 3B:
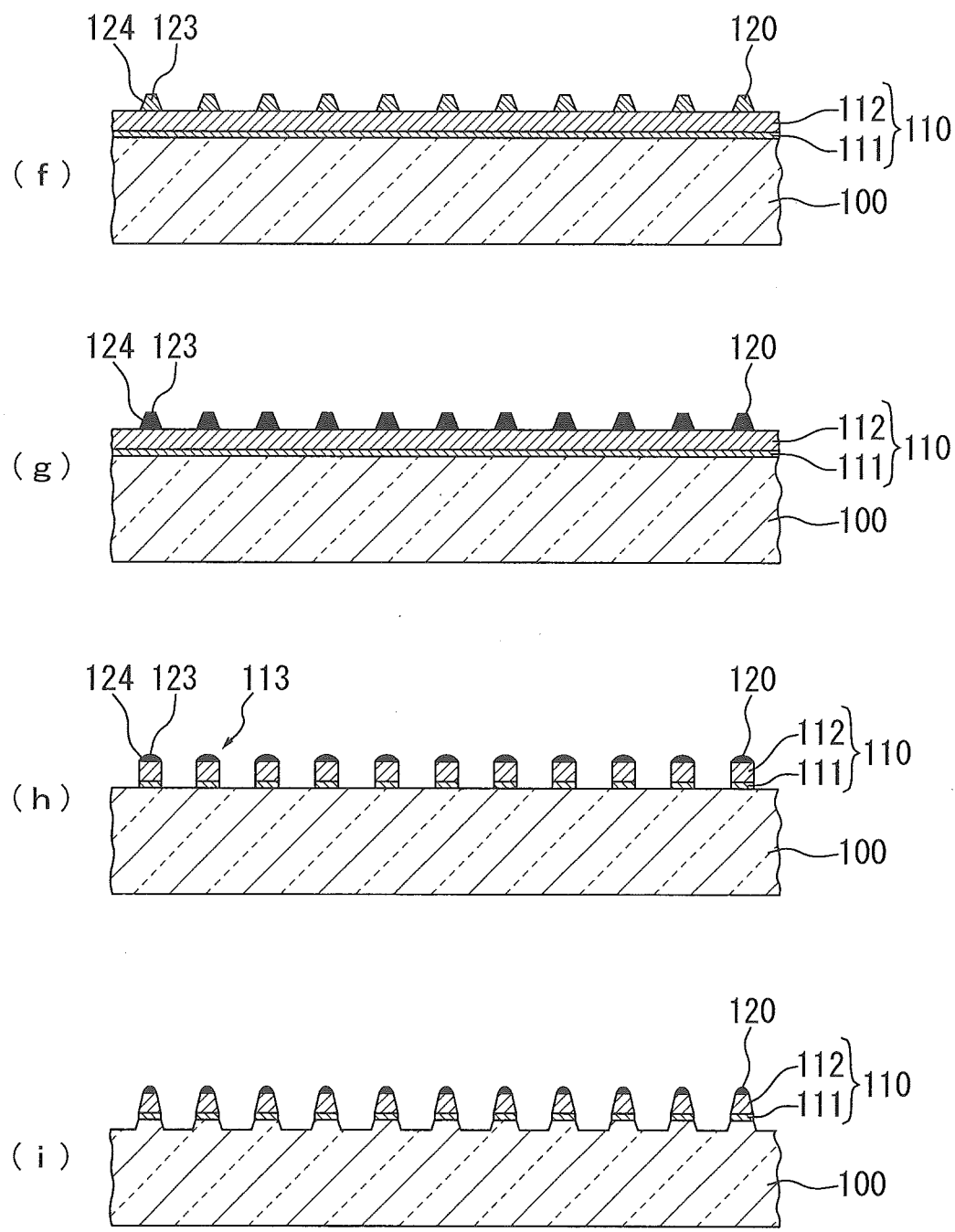
FIG. 3B illustrates the process of a method of etching a subject substrate and a mask layer, in which (f) illustrates a state where a residual film of the resist film is removed, (g) illustrates a state where the resist film is degenerated, (h) illustrates a state where the mask layer is etched using the resist film as a mask, and (i) illustrates a state where a subject substrate is etched using the mask layer as a mask.

FIG. 3B illustrates the process of a method of etching a subject substrate and a mask layer, in which (f) illustrates a state where a residual film of the resist film is removed, (g) illustrates a state where the resist film is degenerated, (h) illustrates a state where the mask layer is etched using the resist film as a mask, and (i) illustrates a state where a subject substrate is etched using the mask layer as a mask. In the drawing, a degenerated resist film is depicted in black.

Figure 3C:
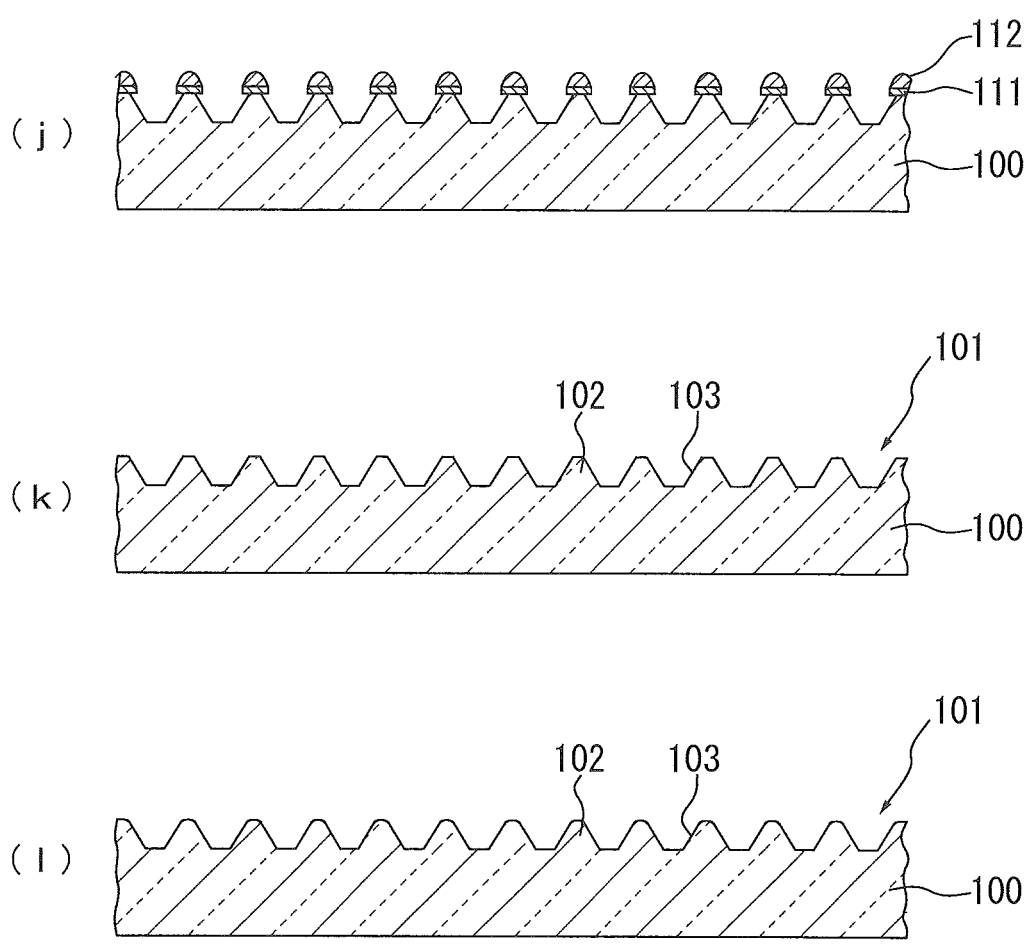
FIG. 3C illustrates the process of a method of etching a subject substrate and a mask layer, in which (j) illustrates a state where the subject substrate is further etched using the mask layer as a mask, (k) illustrates a state where a remaining mask layer is removed from the subject substrate, and (l) illustrates a state where the subject substrate is wet-etched.

FIG. 3C illustrates the process of a method of etching a subject substrate and a mask layer, in which (j) illustrates a state where the subject substrate is further etched using the mask layer as a mask, (k) illustrates a state where a remaining mask layer is removed from the subject substrate, and (l) illustrates a state where the subject substrate is wet-etched;

First, as illustrated in (a) of FIG. 3A, a non-processed subject substrate 100 is prepared. Before etching, the subject substrate 100 is washed with a predetermined washing solution. In the present embodiment, the subject substrate 100 is a sapphire substrate.

Subsequently, as illustrated in (b) of FIG. 3A, a mask layer 110 is formed on the subject substrate 100 (mask layer forming step: S1). In the present embodiment, the mask layer 110 includes a $SiO_2$ layer 111 on the subject substrate 100 and a Ni layer 112 on the $SiO_2$ layer 111. The thicknesses of the layers 111 and 112 are optional, and for example, the $SiO_2$ layer has a thickness between 1 nm and 100 nm and the Ni layer 112 has a thickness between 1 nm and 100 nm. The mask layer 110 may be a single layer. The mask layer 110 is formed according to a sputtering method, a vacuum deposition method, a CVD method, or the like.

Subsequently, as illustrated in (c) of FIG. 3A, a resist film 120 is formed on the mask layer 110 (resist film forming step: S2). In the present embodiment, a thermoplastic resin is used as the resist film 120 and the resist film 120 is formed in a uniform thickness according to a spin coating method. The resist film 120 is formed from an epoxy-based resin, for example, and a thickness thereof is between 100 nm and 300 nm, for example. Moreover, a photo-curing resin that can be cured with an ultraviolet ray or the like can be used as the resist film 40.

The resist film 120 is heated together with the subject substrate 100 to soften, and as illustrated in (d) of FIG. 3A, the resist film 120 is pressed by a mold 130. Concave-convex structures 131 are formed on a contact surface of the mold 130, and the resist film 120 is deformed according to the concave-convex structures 131.

After that, the resist film 120 is cooled together with the subject substrate 100 to harden while maintaining the pressed state. When the mold 200 is separated from the resist film 120, as illustrated in (e) of FIG. 3A, the concave-convex structures 121 are transferred to the resist film 120 (pattern forming step: S3). Here, the period of the concave-convex structures 121 is 1 µm or smaller. In the present embodiment, the period of the concave-convex structures 121 is 500 nm. Moreover, in the present embodiment, the width of a convex portion 123 of the concave-convex structures 121 is between 100 nm and 300 nm. Further, the height of the convex portion 123 is between 100 nm and 300 nm. In this state, a residual film 122 is formed on a concave portion of the resist film 120.

The subject substrate 100 on which the resist film 120 is formed in this manner is mounted on the substrate holder 2 of the plasma etching apparatus 1. The residual film 122 is removed by plasma ashing, for example, and as illustrated in (f) of FIG. 3B, the mask layer 110 which is a subject material is exposed (residual film removing step: S4). In the present embodiment, an $O_2$ gas is used as a processing gas for plasma ashing. In this case, the convex portion 123 of the resist film 120 is affected by the ashing, and a side surface 124 of the convex portion 123 is not vertical to the surface of the mask layer 110 but is inclined by a predetermined angle.

As illustrated in (g) of FIG. 3B, the resist film 120 is exposed to plasma under a degeneration condition to degenerate the resist film 120 and increase an etching selectivity (resist degenerating step: S5). In the present embodiment, an Ar gas is used as a processing gas for degenerating the resist film 120, and a predetermined bias output is applied whereby an Ar gas plasma is induced to the resist film 120. Moreover, in the present embodiment, a bias output of the power supply 5 in the degeneration condition is set to be lower than that of an etching condition described later.

After that, the mask layer 110 as a subject material is etched using the resist film 120 which is exposed to plasma under the etching condition and which has an increased etching selectivity as a mask (mask layer etching step: S6). In the present embodiment, an Ar gas is used as a processing gas for etching the resist film 120, and a bias output higher than that of the degeneration condition is applied whereby Ar gas plasma is induced to the resist film 120. In this way, as illustrated in (h) of FIG. 3B, a pattern 113 is formed on the mask layer 110.

Here, although a processing gas, an antenna output, a bias output, and the like can be changed appropriately in the degeneration condition and the etching condition, the bias output may be changed using the same processing gas as in the present embodiment. Specifically, in the degeneration condition, when an Ar gas was used as a processing gas, a back pressure was 0.5 Pa, a flow rate of the Ar gas was 25 sccm, an antenna output of the coil 4 was 350 W, and a bias output of the power supply 5 was 50 W, a cured portion of the resist film 120 was observed. Moreover, in the etching condition, when an Ar gas was used as a processing gas, a back pressure was 0.5 Pa, a flow rate of the Ar gas was 25 sccm, an antenna output of the coil 4 was 350 W, and a bias output of the power supply 5 was 100 W, an etched portion of the mask layer 110 was observed. In addition to decreasing the bias output of the etching condition, the resist can also be cured by decreasing the antenna output and decreasing the gas flow rate.

Subsequently, as illustrated in (i) of FIG. 3B, the subject substrate 100 is etched using the mask layer 110 as a mask (subject substrate etching step: S7). In the present embodiment, etching is performed in a state where the resist film 120 is left on the mask layer 110. Moreover, plasma etching is performed using a chlorine-based gas such as $BCl_3$ gas as a processing gas.

As illustrated in (j) of FIG. 3C, when etching progresses, concave-convex structures 101 are formed on the subject substrate 100. In the present embodiment, the height of the concave-convex structures 101 is 500 nm. The height of the concave-convex structures 101 may be larger than 500 nm. Here, when the height of the concave-convex structures 101 is relatively as small as 300 nm, for example, etching may be stopped in a state where the resist film 120 is left as illustrated in (i) of FIG. 3B.

In the present embodiment, side etching is promoted by the $SiO_2$ layer 111 of the mask layer 110, and the side surface 103 of the convex portion 102 of the concave-convex structures 101 is inclined. Moreover, the side etching state can be controlled by an inclination angle of the side surface 123 of the resist film 120. When the mask layer 110 is made up of a single layer of the Ni layer 112, the side surface 103 of the convex portion 102 can be made approximately vertical to the principal surface.

After that, as illustrated in (k) of FIG. 3B, the mask layer 110 remaining on the subject substrate 100 is removed using a predetermined removal solution (mask layer removing step: S8). In the present embodiment, the Ni layer 112 is removed using hot nitric acid, and then, the $SiO_2$ layer 111 is removed using hydrofluoric acid. Even when the resist film 120 remains on the mask layer 110, although the Ni layer 112 can be removed together using hot nitric acid, it is preferable to remove the resist film 120 in advance by $O_2$ ashing if a large amount of the resist film 120 remains.

As illustrated in (l) of FIG. 3B, the corners of the convex portion 102 are removed using wet-etching to form a round portion (round portion forming step: S9). Here, although an optional etching solution may be used, an aqueous solution of phosphoric acid heated to approximately 170° C. (so-called "hot phosphoric acid"), for example, can be used. The round portion forming step may be omitted appropriately. With these steps, the subject substrate 100 having the concave-convex structures 101 on the surface is obtained.

According to the etching method of the subject substrate 100, since the resist film 120 is degenerated by exposing to plasma, it is possible to increase the etching selectivity between the mask layer 110 and the resist film 120. By doing so, it is easy to form fine and deep shapes on the mask layer 110 and the mask layer 110 having a fine shape can be formed sufficiently thick.

Moreover, with the plasma etching apparatus 1, degeneration of the resist film 120 and etching of the mask layer 110 can be performed continuously, and the number of steps does not increase remarkably. In the present embodiment, degeneration of the resist film 120 and etching of the mask layer 110 are performed by changing the bias output of the power supply 5, and the selectivity of the resist film 120 can be increased easily.

Further, since the subject substrate 100 is etched using the sufficiently thick mask layer 110 as a mask, it is easy to form fine and deep shapes on the subject substrate 100. In particular, in the etching method of the present embodiment, it is possible to form the concave-convex structures 101 having a period of 1 µm or smaller and a depth of 300 nm or larger on the sapphire substrate, which is not possible in the conventional etching method in which a resist film is formed on a substrate having a mask layer formed thereon and the mask layer is etched using the resist film. In particular, the etching method of the present embodiment is ideal for forming concave-convex structures having a period of 1 µm or smaller and a depth of 500 nm or larger.

Nano-scale periodical concave-convex structures are referred to as moth-eye structures. When the moth-eye structures are formed on a sapphire, the structures can only be formed to a depth of approximately 200 nm since the sapphire is a material that is difficult to machine. However, steps of approximately 200 nm are sometimes insufficient for the moth-eye structures. The etching method of the present embodiment solves a new problem associated with forming moth-eye structures on a sapphire substrate.

Although a resist pattern is formed using a nano-printing technique, the resist pattern may be formed by irradiating with electron beams using a stencil mask or the like, for example.

Moreover, although the mask layer 110 made up of the $SiO_2$ layer and the Ni layer is illustrated as the subject material, the mask layer 110 may naturally be a single Ni layer or other material. The point is that the resist is degenerated so as to increase the etching selectivity between the mask layer 110 and the resist film 120.

Further, although the subject substrate 100 is etched using the mask layer 110, the subject substrate 100 may be etched without using the mask layer 110. In this case, the subject substrate 100 is a subject material, the resist film 120 is formed on the subject substrate 100, and the resist is degenerated to increase the etching selectivity. According to this embodiment, it was confirmed that, even when the resist film was formed directly on the sapphire substrate, it was possible to etch the sapphire substrate without using the mask layer.

Moreover, although the bias output of the plasma etching apparatus 1 is changed to set the degeneration condition and the etching condition, the conditions may be set by changing the processing gas, for example, in addition to changing the antenna output and the gas flow rate. The point is that the degeneration condition is such a condition that the resist is degenerated when exposed to plasma and the etching selectivity is increased.

Moreover, although a sapphire is used as the subject substrate 100 and the mask layer 110 includes the Ni layer 110, it is naturally possible to apply the present invention when etching other materials. For example, a subject substrate to be etched may be a SiC substrate, a Si substrate, a GaAs substrate, a GaN substrate, an InP substrate, a ZnO substrate, and the like. It was actually confirmed that, when the same mask layer 110 made up of a $SiO_2$ layer and a Ni layer as the embodiment was formed on a SiC substrate, and a resist film was cured under the same condition as the embodiment, the SiC substrate was successfully etched using a $SF_6$-based gas. Moreover, when these substrates are processed, it is optional whether the mask layer is used or not.

FIG. 4 illustrates a subject substrate, in which (a) is a schematic perspective view and (b) illustrates an A-A cross-sectional view.

Figure 4A:
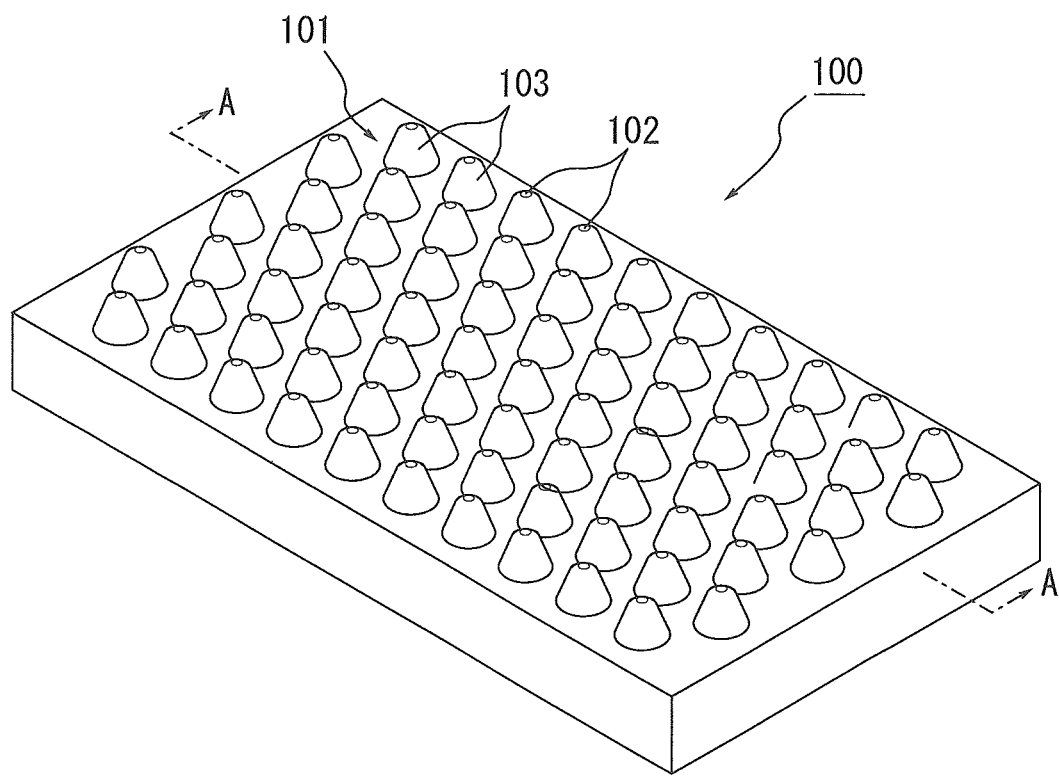
FIG. 4 illustrates a subject substrate, in which (a) is a schematic perspective view and (b) illustrates an A-A cross-sectional view.
Figure 4B:
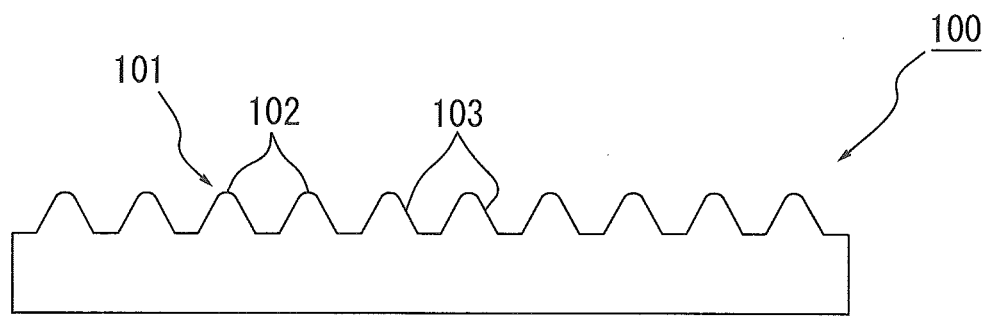

The subject substrate 100 manufactured through the above-described steps will be described. In the present embodiment, as illustrated in FIGS. 4(a) and 4(b), the concave-convex structures 101 include a plurality of convex portions 102 formed periodically, and a concave portion is formed between the convex portions 102. In the present embodiment, the respective convex portions 102 have a truncated conical shape, the top of which is removed. The convex portion 102 may have other truncated pyramidal shapes such as truncated polygonal pyramidal shapes, and pyramidal shapes such as conical shapes or polygonal pyramidal shapes in addition to the truncated conical shape. The concave portion instead of the convex portion 102 may have a pyramidal shape, a truncated conical shape, a truncated pyramidal shape, and the like. In the present embodiment, the concave-convex structures 101 are formed at a predetermined period so as to be arranged at the intersections of imaginary triangular lattices so that the centers of the convex portions 102 are located at the apexes of a regular triangle in a plan view.

In the present embodiment, the period of the convex portions 102 is 500 nm. The period referred herein is the distance between the peaks of the heights of the adjacent convex portions 102. Moreover, the base end of each convex portion 102 has a diameter of 200 nm and a height of 600 nm. The period, dimensions, shape, and the like of the convex portions 102 can be changed appropriately.

Figure 5:
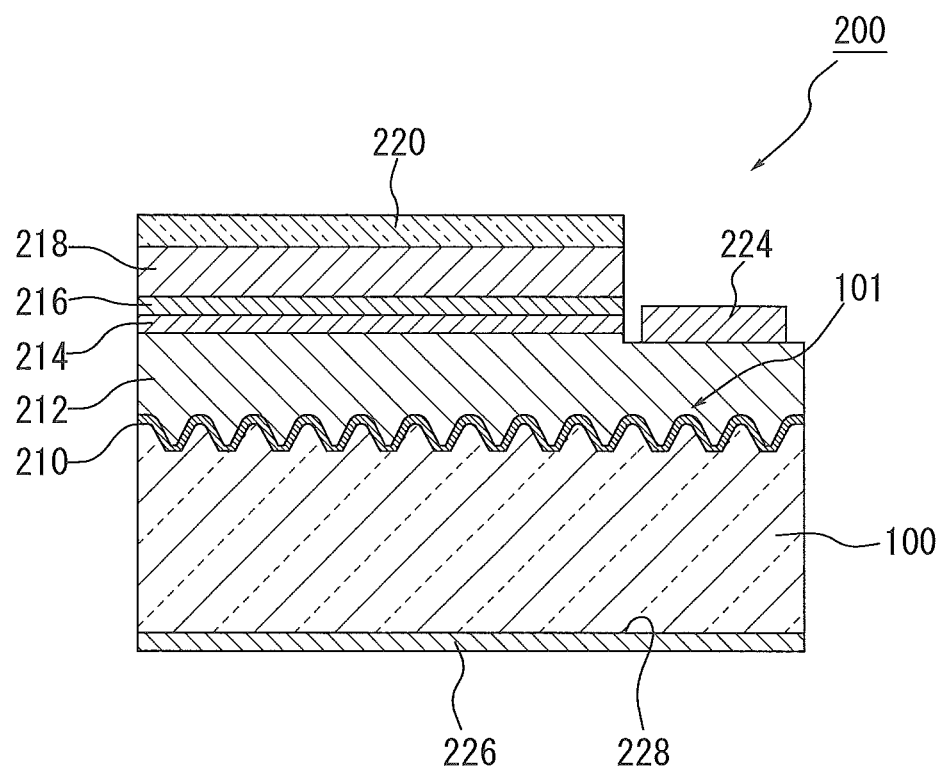
FIG. 5 illustrates a schematic cross-sectional view of a light-emitting device including a subject substrate.

By using the subject substrate 100, a light-emitting device 200 illustrated in FIG. 5, for example, can be manufactured. The light-emitting device 200 is a face-up LED, in which a III-nitride semiconductor layer is formed on a surface of the subject substrate 100 on which the concave-convex structures 101 are formed. The III-nitride semiconductor layer includes a buffer layer 210, a n-type GaN layer 212, a multiple quantum well active layer 214, an electron blocking layer 216, and a p-type GaN layer 218 which are arranged in that order from the subject substrate 100. A p-side electrode 220 is formed on the p-type GaN layer 218, and an n-side electrode 224 is formed on the n-type GaN layer 212. Moreover, a reflecting film 226 is formed on a rear surface of the sapphire substrate 2. The resist film 226 can be formed of a dielectric multi-layer film and an Al layer, for example.

The buffer layer 210 is formed of AlN, the n-type GaN layer 212 is formed of n-GaN, and the multiple quantum well active layer 214 is formed of GaInN and GaN. In the present embodiment, a peak wavelength of emission of the multiple quantum well active layer 214 is 450 nm. Moreover, the electron blocking layer 216 is formed of p-AlGaN, and the p-type GaN layer 218 is formed of p-GaN. The layers extending from the n-type GaN layer 212 to the p-type GaN layer 218 are formed by epitaxial growth of the III-nitride semiconductor, and the concave-convex structures 101 are present on the subject substrate 100. In this case, the III-nitride semiconductor grows in the lateral direction in the initial growth stage whereby planarization is achieved.

The p-side electrode 220 is formed of a transparent material such as indium tin oxide (ITO), for example. Moreover, the n-side electrode 224 is formed on the n-type GaN layer 212 exposed by etching the p-type GaN layer 218 to the n-type GaN layer 212. The n-side electrode 224 is formed by stacking Ti, Al, Ti, and Au, for example.

In this light-emitting device 200, a surface of the reflecting film 226 close to the subject substrate 100 forms a reflecting surface 228, light emitted from an active layer 214 passes through the interface of the concave-convex structures 101 by a diffraction effect, and the light is reflected from the reflecting surface 228. In this way, the light having passed by the diffraction effect enters the interface again and the light is caused to pass again using the diffraction effect, whereby light can be taken outside the light-emitting device in a plurality of modes. In order to obtain the diffraction effect, the period of the convex portions 101 is preferably larger than an optical wavelength of the light emitted from the multiple quantum well active layer 214 and smaller than a coherent length of the light.

Here, the optical wavelength means a value obtained by dividing an actual wavelength by a refractive index. Moreover, the coherent length corresponds to a distance in which periodic vibrations of waves cancel each other due to a difference between individual wavelengths of a group of photons having a predetermined spectrum width so that interference disappears. The coherent length lc satisfies a relation of $lc=(\lambda^2/\Delta\lambda)$ in which the wavelength of light is $\lambda$ and a full width at half maximum of the light is $\Delta\lambda$. Here, the period of each convex portion 102 is preferably larger than twice the optical wavelength of the light emitted from the multiple quantum well active layer 214. Moreover, the period of the convex portions 102 is preferably equal to or smaller than half the coherent length of the light emitted from the multiple quantum well active layer 214.

In the present embodiment, the period of the convex portions 102 is 500 nm. Since the wavelength of the light emitted from the active layer 214 is 450 nm and the refractive index of the III-nitride semiconductor layer is 2.4, the optical wavelength is 187.5 nm. Moreover, since the full width at half maximum of the light emitted from the active layer 214 is 63 nm, the coherent length of the light is 3214 nm. That is, the period of the concave-convex structures 101 is larger than twice the optical wavelength of the active layer 214 and is equal to or smaller than half the coherent length.

As described above, although the subject substrate 100 formed of sapphire is used as the light-emitting device 200, the subject substrate 100 can be used for other devices, and specific applications and the like can be changed appropriately.

REFERENCE SIGNS LIST

1: PLASMA ETCHING APPARATUS
2: SUBSTRATE HOLDER
3: CONTAINER
4: COIL
5: POWER SUPPLY
6: QUARTZ PLATE
7: COOLING CONTROLLER
8: PLASMA
100: SUBJECT SUBSTRATE
101: CONCAVE-CONVEX STRUCTURE
102: CONVEX PORTION
103: SIDE SURFACE
200: LIGHT-EMITTING DEVICE
210: BUFFER LAYER
212: n-TYPE GAN LAYER
214: MULTIPLE QUANTUM WELL ACTIVE LAYER
216: ELECTRON BLOCKING LAYER
218: p-TYPE GAN LAYER
220: p-SIDE ELECTRODE
224: n-SIDE ELECTRODE
226: REFLECTING FILM
228: REFLECTING SURFACE

The invention claimed is:

1. A method of etching a substrate comprising:
   forming a mask layer on a substrate;
   forming a resist film on the mask layer;
   forming a concave-convex surface of the resist film;
   etching the resist film to remove a concave portion of the resist film;
   exposing the resist film to a plasma under a degeneration condition to increase an etching selectivity of the mask layer over the resist film, the degeneration condition including setting a power supply for generating the plasma to a first power level;
   etching the mask layer using the resist film which is exposed to plasma under an etching condition, the etching condition including setting the power supply to a second power level which is greater than the first power level; and
   etching the substrate using the etched mask layer as a mask, to form a concave-convex surface of the substrate,
   wherein the mask layer comprises:
   a $SiO_2$ layer formed on the substrate; and
   a Ni layer on the $SiO_2$ layer.

2. The method of claim 1, wherein a thickness of the $SiO_2$ layer and the Ni layer is between 1 nm and 100 nm, and a thickness of the resist film is between 100 nm and 300 nm.

3. The method of claim 1, wherein the forming of the concave-convex surface of the resist film comprises:
   heating the resist film to soften the resist film; and
   pressing a mold onto the resist film to deform the resist film.

4. The method of claim 1, wherein a width of a convex portion of the concave-convex surface of the resist film is between 100 nm and 300 nm, and a height of the convex portion is between 100 nm and 300 nm.

5. The method of claim 1, wherein the degeneration condition and the etching condition include using Ar gas as a processing gas.

6. The method of claim 1, further comprising:
   performing a wet etching to remove a corner of a convex portion of the concave-convex surface of the substrate.

7. The method of claim 1, wherein the concave-convex surface of the substrate includes concave-convex structures having a period of 1 μm or less and a depth of 300 nm or greater.

8. The method of claim 1, wherein a processing gas in the degeneration condition and a processing gas in the etching condition comprise the same gas.

9. The method of claim 1, further comprising:
placing the substrate in a plasma etching apparatus comprising a substrate holder that holds the substrate, the power supply being connected to the substrate holder,
wherein the exposing of the resist film comprises supplying a high-frequency power from the power supply to the substrate holder at the first power level.

10. The method of claim 9, wherein the etching of the mask layer comprises supplying a high-frequency power from the power supply to the substrate holder at the second power level.

* * * * *